United States Patent [19]

Frank-Peter

[11] Patent Number: 4,901,034

[45] Date of Patent: Feb. 13, 1990

[54] PROCESS AND CIRCUIT FOR EXCITING AN ULTRASONIC GENERATOR AND ITS USE FOR ATOMIZING A LIQUID

[75] Inventor: Jagdt Frank-Peter, Schofflisdorf, Switzerland

[73] Assignee: Satronic, AG, Dielsdorf, Switzerland

[21] Appl. No.: 345,344

[22] Filed: Apr. 28, 1989

[30] Foreign Application Priority Data

May 6, 1988 [CH] Switzerland ........................ 1728/88

[51] Int. Cl.[4] ........................ H03L 7/12; H03B 23/00

[52] U.S. Cl. ........................ 331/4; 310/316; 239/102.2; 331/154; 331/178

[58] Field of Search ........................ 331/4, 178, 154; 366/116; 310/314, 316; 318/116; 239/102.2

[56] References Cited

U.S. PATENT DOCUMENTS

| | | | |
|---|---|---|---|
| 4,275,363 | 6/1981 | Mishiro et al. | 331/4 |
| 4,642,581 | 2/1987 | Erickson | 331/154 |
| 4,703,213 | 10/1987 | Gäsler | 310/316 |
| 4,808,948 | 2/1989 | Patel et al. | 331/4 |

*Primary Examiner*—Siegfried H. Grimm
*Attorney, Agent, or Firm*—Helfgott & Karas

[57] ABSTRACT

In a process and a circuit for exciting an ultrasonic generator the latter is excited by an output signal of a voltage-controlled oscillator, which is controlled by a control device including a triangular wave generator so that its frequency is periodically swept in a range covering the series resonance of the ultrasonic generator. A measured quantity value, which can be voltage or current corresponding to the damping of the ultrasonic generator, is formed and is compared with the maximum permitted damping. If the established damping is smaller than the maximum permitted damping, the oscillator is additionally regulated as a function of the measured quantity. This measured quantity is preferably a function of the exciting current of the ultrasonic generator. An instantaneous measured value and a delayed value are formed and their difference is compared with a threshold value in a comparator. If this difference is the same as the threshold value, the sweep direction in the control device is reversed. The power at the ultrasonic generator can be regulated by varying the operating voltage of an output stage connected upstream of the ultrasonic generator. The process can be used for atomizing a liquid by an ultrasonic generator provided with an atomizer disk.

8 Claims, 2 Drawing Sheets

PROCESS AND CIRCUIT FOR EXCITING AN ULTRASONIC GENERATOR AND ITS USE FOR ATOMIZING A LIQUID

BACKGROUND OF THE INVENTION

The present invention relates to a process and a circuit for exciting an ultrasonic generator, and to the use of the circuit with the ultrasonic generator for atomizing a liquid.

The possibility of atomizing liquids with the aid of piezoelectric ultrasonic generators is known. For example, the article by W.D. Drews "Flüssigkeitszerstäubung durch Ultraschall" in Elektronik, 1979, No. 10, pp. 83 to 90, briefly describes the principle of this process, in which an ultrasonic generator or vibrator is provided with an atomizer disk or plate and a circuit for exciting the ultrasonic generator.

However, several problems are encountered in technically bringing about the atomization of a liquid with the aid of an ultrasonic generator.

As atomization is only possible close to the resonance of the unit comprising the ultrasonic generator and its atomizer plate, it is necessary to very accurately maintain the required exciting frequency. The locking of the oscillator of the exciting circuit to an apparent resonance, not corresponding to an effective atomization, must be reliably prevented.

The exciting circuit must be in a position to follow the exciting frequency corresponding to the changes of different parameters..Such parameters are e.g. the manufacturing tolerances of the mechanical components of the ultrasonic generator and in particular its atomizer disk, the variations to the mechanical and electrical parameters of the piezoceramics used for its production, the operating temperature of the ultrasonic generator (very important when used in burners), the aging of the ultrasonic generator, the deposits formed thereon (such as e.g. soot and resins when used in burners), the characteristics of the medium to be atomized and the manufacturing, adjustment and other tolerances in the exciting circuit.

It must be possible to reliably detect the stopping of atomization. If the stoppage is caused by droplets sticking to the atomizer disk, a removal of the droplets from the disk must be ensured.

A practical requirement concerning the industrial usability is the free interchangeability of the exciting circuit and the ultrasonic generator or optionally its atomizer disk without any adjustments and without high tolerance requirements on the spares of the components of the circuit (which is particularly important when individual components are replaced for repair purposes).

The active power of the ultrasonic generator or its atomizer disk must be regulatable in a very wide dynamic range and the control of the active power and the frequency must not reciprocally influence one another. In addition, changes to the aforementioned parameters and the operating voltage must have little or no influence on the operation of the control loops.

Various processes and circuits have already been proposed for solving these problems.

DE-3222425 proposes exciting the ultrasonic generator by means of a matching network, which inter alia suppresses the oscillation of the ultrasonic generator to harmonics of its resonant frequency. The direct current component of the resonator current is used for regulating the exciting current and the alternating current component of the resonator current is used for regulating the exciting frequency, a low-pass filter only allowing the frequency component to pass to the desired resonant frequency of the ultrasonic generator. In the case of resonance failure, the exciting frequency is wobbled or swept, in order to pass through the resonance point and achieve relocking. However, it is a disadvantage of this solution that the circuit must be matched to the ultrasonic generator and in particular to its desired resonant frequency, so that the operation of the ultrasonic generator cannot follow the changes of certain of the aforementioned parameters and the necessary easy interchangeability of the components is not ensured. A reliable operation during oscillation, particularly under load and under varying operating conditions, is not ensured, because the impedance and therefore the phase relationships between the current and voltage of the ultrasonic generator vary considerably in the case of load changes and therefore a following of the optimum oscillation frequency, derived from phase relationships between the current and voltage in the ultrasonic generator, is not possible. It is not possible to achieve a true compensation of the capacitance of the ultrasonic generator by means of an inductance coil, due to the capacitance which varies during operation and particularly during load changes.

A somewhat different construction is proposed in U.S. 4,275,363, but the same, aforementioned disadvantages occur.

DE-3534853 proposes operating the ultrasonic generator with timed excitation power (bursts) and carrying out a current measurement at specific times for automatic frequency matching. The necessary intermediate storage of the current measurement values and the precise synchronization of the control sequences are particularly disadvantageous and costly.

Swiss patent application 3155/87-0 of 8-17-1987 inter alia proposes, with a constant exciting voltage at the ultrasonic generator, to regulate the power by means of a variation of the operating frequency in the frequency range between the series resonance and the parallel resonance of the ultrasonic generator. The amplification of the control loop intended for this purpose is such that slight control oscillations occur if the ultrasonic generator oscillates in undamped manner. However, if the control oscillations are missing, a wobbulator or sweep generator is locked on, in order to shake off any droplets attached to the ultrasonic generator and to again seek the operating frequency. It is a disadvantage that in the case of ultrasonic generators which do not reach the maximum settable power, the exciting circuit in the case of a high power demand can no longer be locked on the desired operating frequency. A further disadvantage is that the current/frequency characteristic has a limited steepness close to the parallel resonance, i.e. at low power levels, which leads to a stoppage of the control oscillation and therefore to inappropriate locking on of the sweep generator. The dynamic range of the power control is greatly restricted by these two phenomena.

SUMMARY OF THE INVENTION

It is an object of the present invention to obviate the aforementioned disadvantages and to provide an inexpensive, operationally reliable control of an ultrasonic generator.

This and other objects of the invention are attained by a process of exciting an ultrasonic generator by an output signal of a voltage-controlled oscillator, wherein the control voltage of the oscillator is regulated in such a way that its frequency is periodically swept in a predetermined range covering the frequency of the series resonance of the ultrasonic generator, and wherein a control quantity corresponding to the damping of the ultrasonic generator is formed and is compared with a predetermined threshold value, which corresponds to a predetermined maximum permitted damping, and if the comparison reveals that the damping of the ultrasonic generator is lower than the maximum permitted damping, the control voltage is additionally regulated as a function of a measured quantity.

The objects of the present invention are also attained by a circuit for exciting an ultrasonic generator which comprises a control loop of a voltage-controlled oscillator for exciting the ultrasonic generator across a driver stage and an output stage, a current sensing resistor connected to the output stage, an all-pass filter, to which is supplied a voltage at the current sensing resistor and which supplies a correspondingly delayed voltage, a comparator which compares the voltage at the current sensing resistor with the voltage delayed in the all-pass filter and supplies a signal to the clock input of a flip-flop whereas a signal occurring at an output of the flip-flop is supplied to a triangular wave generator, which determines the frequency of the voltage-controlled oscillator.

The aforementioned objects, features and advantages of the invention will, in part, be pointed out with particularity, and will, in part, become obvious from the following more detailed description of the invention, taken in conjunction with the accompanying drawing, which form an integral part thereof.

DETAILED DESCRIPTION OF THE PREFERRED EMBODIMENT

Figure 1:
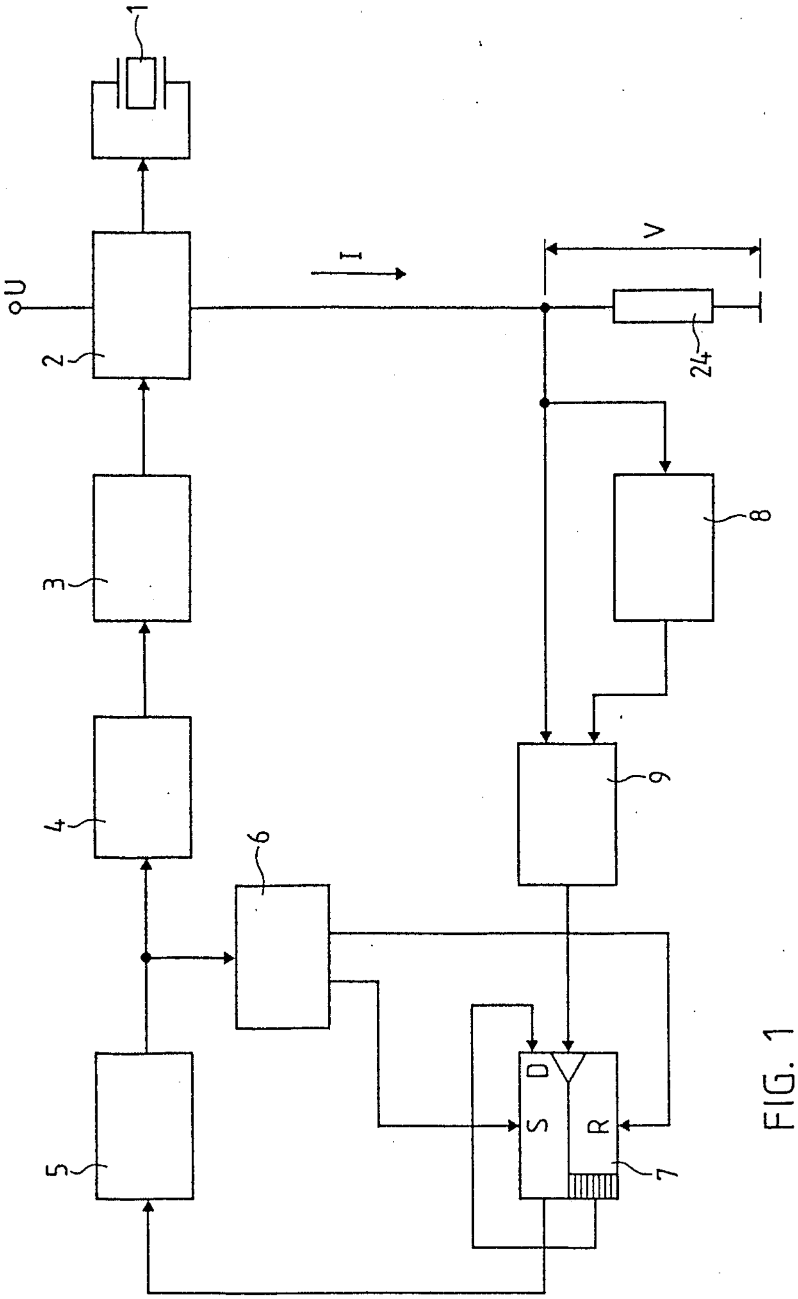
FIG. 1 is a block circuit diagram of a circuit for exciting an ultrasonic generator according to the present invention.

FIG. 1 shows a circuit for exciting an ultrasonic generator or vibrator 1, whose per se known atomizer disk or plate (cf. e.g. DE-3534853) is not shown. The ultrasonic generator 1 is excited by means of a final or output stage 2, shown in detail in FIG. 2. The output stage 2 is supplied with current I from a direct current voltage source U. The output stage 2 is controlled by a driver stage 3, which in turn receives a signal of frequency f from a voltage-controlled oscillator 4.

The voltage-controlled oscillator (VCO) 4 is known per se and constructed of commercially available components. The permitted voltage swing at its control input is predetermined, whilst the corresponding frequency swing at its signal output can be adjusted in a known per se manner by the value of the frequency-determining components, which are known and for the sake of clarity not shown in FIG. 1 and which are connectable to the oscillator 4 and which, when using analog technology, can be resistors and/or capacitors, whilst, when using digital technology, they can comprise a crystal oscillator and signal inputs on corresponding programming inputs.

The control input of oscillator 4 receives a signal from a triangular wave generator 5, so that the frequency f is swept or wobbled as a function of the output voltage of generator 5. In accordance with the sweep direction the triangular wave generator 5 increases or decreases its output voltage and oscillator 4 its frequency f.

Figure 2:
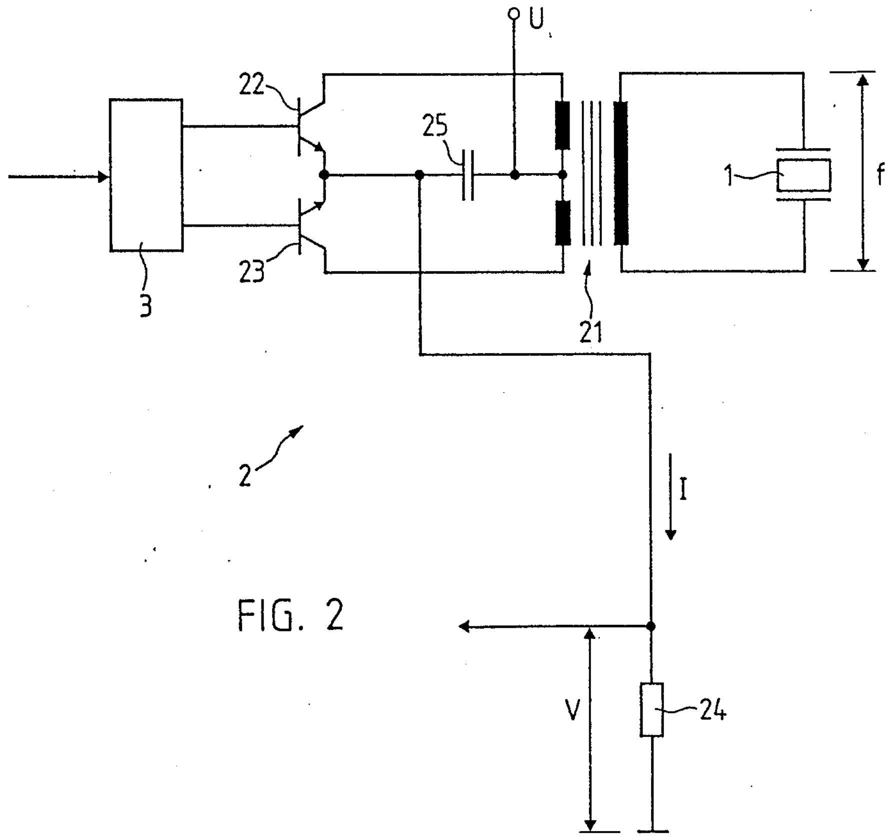
FIG. 2 is a schematic view of an embodiment of the final or output stage of the circuit according to FIG. 1.

FIG. 2 shows in exemplified manner a construction of the output stage 2 of the circuit according to FIG. 1. The ultrasonic generator 1 is excited by means of a transformer 21, which ensures an isolation of the ultrasonic generator 1 and optionally (as a function of the turns ratio) permits the excitation with different voltage ranges of voltage U. The output stage 2 comprises two transistors 22, 23, which are push-pull driven by the driver stage 3 and alternately switch through the current I to in each case half of the primary winding of transformer 21. Driver stage 3 supplies the correct phase signals necessary for transistors 22, 23 as a function of the signal of frequency f supplied to the driver stage 3. Such a driver stage is well known to one skilled in the art and need not be described here. The exciting circuit for the ultrasonic generator 1 is closed by means of a current sensing resistor 24. A capacitor 25 feeds back the changes of current I following frequency f directly from transistors 22, 23 to the source of voltage U and consequently ensures that the voltage drop V occurring at the current sensing resistor 24 is proportional to the mean time value of current I, i.e. has no significant variation on frequency f.

Figure 3:
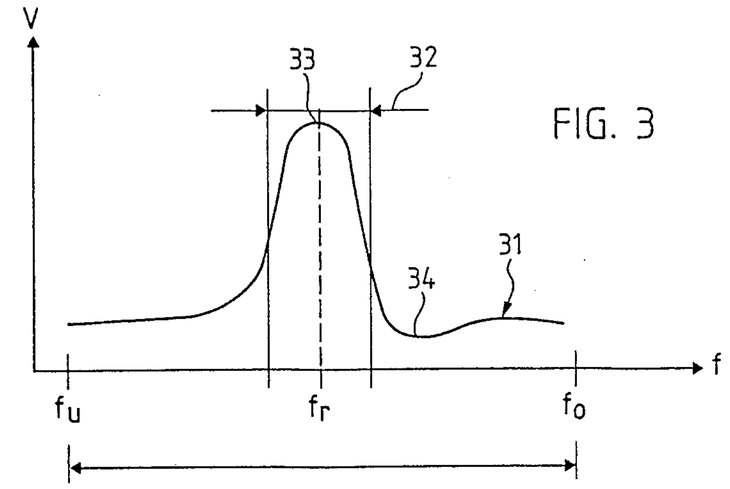
FIG. 3 is a diagrammatic curve of the mean time value of the current flowing through the output stage of the circuit according to FIG. 2 measured as a voltage drop on a current sensing resistor, as a function of the exciting frequency of the ultrasonic generator.

FIG. 3 shows a diagrammatic, i.e. qualitatively represented curve 31 of the mean time value of current I as a function of the exciting frequency f of the ultrasonic generator. On the abscissa is plotted the exciting frequency f and on the ordinate the voltage drop V measured at the current sensing resistor 24. FIG. 3 also shows the frequency range 32 of the control oscillation of a subsequently described resonance detection control loop of the circuit, when the latter is in the state locked on the desired resonant frequency $f_r$.

As the losses in output stage 2 and transformer 21 can be kept adequately small compared with the effective power, the voltage drop V at the current sensing resistor 24 is also a direct measure for the electric power supplied to the ultrasonic generator 1. This is in turn a usable measure for the atomizing power of the ultrasonic generator 1, if the latter is provided with an atomizer disk and is used for atomizing a liquid.

The curve 31 shown in FIG. 3 corresponds to the well known impedance characteristic (i.e. here also reactance characteristic) of a resonance system, like that of a piezoelectric resonator. The maximum value 33 visible on curve 31 corresponds to the series resonance resulting from the known equivalent circuit diagram of a resonator, whilst the detectable minimum value 34 corresponds to the parallel resonance resulting from the same equivalent circuit diagram. The ratio of the currents I at maximum value 33 and minimum value 34 (i.e. also the ratio of the corresponding values of the voltage drop V) is essentially determined by the impedance behavior of the ultrasonic generator 1.

Referring back to FIG. 1, it will be noted that the output voltage of the triangular wave generator 5 is supplied to a window comparator 6. As will be shown hereinafter, this output voltage is always between the two window limits of the window comparator 6. If the output voltage of triangular wave generator 5 now reaches the upper or lower window limit of the window comparator 6, as a function of the window limit which has been reached, the latter controls a setting or resetting input of a D-flip-flop 7, which leads to the toggling of the latter. The conversion of the output signals of a window comparator into control signals for the inputs of a flip-flop is well known and has not been described in detail herein. Thus, the window comparator 6 monitors the sweep direction of oscillator 4 and flip-flop 7 serves as a store for the sweep direction.

One output of flip-flop 7 supplies a signal to a control input of the triangular wave generator 5 and said signal determines the sweep direction. Thus, if the output voltage of the triangular wave generator 5 reaches the upper or lower window limit of the window comparator 6, the toggling of the flip-flop brings about the reversal of the sweep direction and the ultrasonic generator 1 is operated at a frequency which uniformly sweeps or wobbles between a lower frequency $f_u$ and an upper frequency $f_o$ (cf. FIG. 3), for as long as the clock input of flip-flop 7 receives no pulses.

The voltage drop V at the current sensing resistor 24 is delayed by a frequency-dependent amount of time in an all-pass filter 8. The voltage drop V and the voltage drop delayed in the all-pass filter 8 are in each case supplied to an input of a comparator 9, optionally after being freed from spurious signals by a not shown filtering means and after conversion by a not shown conventional amplification means into appropriate signals.

If the signal corresponding to the delayed voltage drop is or becomes greater by an amount given in the comparator 9 than the signal corresponding to the undelayed voltage drop, then the comparator 9 supplies a signal to the clock input of flip-flop 7, which toggles the latter and consequently modifies the signal at the control input of triangular wave generator 5 and reverses the particular sweep direction of oscillator 4. Thus, the sweep direction is determined by the value of the instantaneous difference between the delayed voltage drop and the undelayed voltage drop, or the comparison of said difference with a threshold.

The aforedescribed circuit functions as follows:

If the ultrasonic generator 1 is operated in the state where there are no or inadequately marked resonance peaks 33, inter alia if the ratio of the currents I at maximum 33 and minimum 34 corresponds to a too strongly damped impedance behavior of ultrasonic generator 1, then the sweep direction is reversed if the triangular wave generator 5 supplies an output voltage corresponding to the lower frequency limit $f_u$ or the upper frequency limit $f_o$. This is, for example, the case if the ultrasonic generator 1 provided with an atomizer disk is used for atomizing a liquid and is too strongly damped by attached droplets. The sweep frequency can appropriately be located in the natural resonance range of the attached droplets, in order to remove the latter.

Together the ultrasonic generator 1, output stage 2, current sensing resistor 24, all-pass filter 8, comparator 9, flip-flop 7, triangular wave generator 5, oscillator 4 and driver stage 3 form a control loop which, as a result of its design, carries out control oscillations of the exciting frequency of the ultrasonic generator 1 about its series resonant frequency $f_r$. Through a suitable choice of the lag in the all-pass filter 8 and the switching thresholds in comparator 9, it is ensured that only the path of the resonance curve typical for correct atomization is detected as true resonance. This appropriate choice results from the sweep frequency used, the frequency interval between the series resonance 33 and the parallel resonance 34 of the ultrasonic generator, as well as the control characteristics of the units contained in the control loop. The sweep direction is reversed if the delayed voltage drop is greater by a predetermined amount than the undelayed voltage drop V. As a result the exciting frequency f of ultrasonic generator 1 periodically varies in a range 32 about the resonant frequency, i.e. said frequency control loop oscillates with constant amplitude.

In accordance with the selected sweep rate is obtained the instantaneous frequency and amplitude of current I as a function of the damping of the ultrasonic generator in the resonance range (cf. FIG. 3). A low damping corresponds to a high instantaneous amplitude and a high instantaneous frequency, leading to a correspondingly large difference between the undelayed and delayed voltage drop. If the cutoff frequency of the all-pass filter 8 and the hysteresis of comparator 9 are now chosen in such a way that the latter only operates in the case of an adequately compensated generator, i.e. in the case of using it for ultrasonic atomization when the generator is not "flooded" and reverses the sweep direction, a locking on the resonant frequency $f_r$ is achieved. Otherwise a back indication is automatically received, that a droplet is attached to the ultrasonic generator, because then the exciting frequency f reaches the lower frequency limit $f_u$ or the upper frequency limit $f_o$, so that the window comparator 6 responds, in the manner described hereinbefore.

Thus, the circuit allows the exciting frequency f of the ultrasonic generator to sweep through a predetermined frequency range until the resonance detection is locked in, i.e. the sweep direction is reversed before reaching the frequency limits $f_u$ or $f_o$. The exciting frequency f of the ultrasonic generator then locks on its resonant frequency $f_r$, provided that the latter has a sufficiently high quality (e.g. the ultrasonic generator is not damped by attached droplets). The criteria for locking in is the speed of change of the current I flowing through the output stage 2, which in a first approximation is proportional to the effective power of ultrasonic generator 1.

The desired power of the ultrasonic generator can be adjusted by setting the operating voltage U of the output stage 2, e.g. with the aid of a not shown but conventional, adjustable voltage source. If the effective power of the ultrasonic generator is also to be regulated, then e.g. current I can be multiplied by the operating voltage U and the result of this multiplication can be compared with the desired power.

The here described process has inter alia the advantage that the functions of resonance detection and power regulation are separated, i.e. the resonance detection can operate over a dynamic range of more than 1:10. The process also operates in a continuous manner, i.e. it is not bound by external time sequences and can therefore without difficulty follow changes, such as e.g. changes to the operating damping, the power, the resonant frequency, etc. Attached droplets are more rapidly shaken off than when using the hitherto known processes, because there is no rigid sweep over the entire frequency range and instead the circuit sweeps as from a given damping reduction level, e.g. in the case of partly shaken off droplets, between the frequency with the highest effective power at the particular time and one of the two frequency limits.

In analogy to the circuit described in connection with FIG. 1, the analysis of curve 31 can also take place by directly deriving the current I or the voltage drop V on the basis of frequency f. This is equivalent to a derivation of the current I or the voltage drop V on the basis of time, because the frequency f determined by the triangular wave generator 5 varies linearly with the time. In addition, such a derivation is only the limit case of the previously described subtraction in the case of a time delay on the all-pass filter 8 which is tending towards zero.

The invention has been described in conjunction with an ultrasonic generator, particularly a piezoelectric ultrasonic generator, whose use is e.g. the atomization of a liquid. However, the invention can also advantageously be used on other resonance systems, whose resonance is in a clearly defined frequency range and which can vary as a function of different parameters and in particular the standard dispersion of the characteristics of mass produced ultrasonic generators and circuit components.

What is claimed is:

1. A process for exciting an ultrasonic generator, comprising the steps of providing a voltage-controlled oscillator and exciting said ultrasonic generator by an output signal of said voltage-controlled oscillator, wherein a control voltage of the oscillator is regulated in such a way that a frequency of said oscillator is periodically swept in a predetermined range covering the frequency of the series resonance of the ultrasonic generator, the method further comprising the steps of forming a measured control quantity corresponding to the damping of the ultrasonic generator and comparing said measured control quantity with a predetermined threshold value which corresponds to a predetermined maximum permitted damping, and additionally regulating said control voltage as a function of said measured quantity if the comparison reveals that the damping of the ultrasonic generator is lower than the maximum permitted damping.

2. The process according to claim 1, wherein said measured quantity is the value of a function of the exciting current of the ultrasonic generator.

3. The process according to claim 2, wherein an instantaneous value and a delayed value of the measured quantity and a difference of said values are formed, said difference being compared with the threshold value and, if said difference is the same as the threshold value, the direction of change of the control voltage is reversed.

4. The process according to claim 3, wherein the measured quantity is delayed by an all-pass filter having a characteristic curve for the delay which is selected as a function of the frequency, in such a way that said difference is the same as the threshold value only if the damping of the ultrasonic generator is lower than the maximum permitted damping.

5. The process according to claim 2, wherein the measured quantity is the derivation of the exciting current depending on the frequency.

6. The process according to claim 1, wherein the limits of the range, in which the oscillator frequency is swept, are selected in such a way that, taking account of tolerances for characteristics of the ultrasonic generator, its effective resonant frequencies are located within said range, but its spurious resonances are located outside said range.

7. The process according to claim 1, wherein a power at the ultrasonic generator is regulated by varying an operating voltage of an output stage interconnected between the voltage-controlled oscillator and the ultrasonic generator.

8. A circuit for exciting an ultrasonic generator comprising: a voltage-controlled oscillator having an output connected through a driver stage and an output stage to said ultrasonic generator for exciting said ultrasonic generator; a control loop for said voltage-controlled oscillator including a current sensing resistor connected to said output stage, an all-pass filter to which is supplied a voltage (V) at the current sensing resistor, a comparator to which are supplied said voltage (V) at the current sensing resistor and a correspondingly delayed voltage from said all-pass filter, said comparator supplying a signal indicative of a compared value to a clock input of a flip-flop circuit, while a signal occurring at an output of said flip-flop circuit is supplied to a triangular wave generator which is connected to a control input of said voltage-controlled oscillator to determine the frequency (f) of said voltage-controlled oscillator.

* * * * *